(12) United States Patent
Wang et al.

(10) Patent No.: US 10,608,006 B2
(45) Date of Patent: Mar. 31, 2020

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Wen-Jen Wang, Tainan (TW);
Chun-Hung Cheng, Kaohsiung (TW);
Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/038,197

(22) Filed: Jul. 18, 2018

(65) Prior Publication Data
US 2020/0013793 A1    Jan. 9, 2020

(30) Foreign Application Priority Data
Jul. 9, 2018   (CN) .......................... 2018 1 0743179

(51) Int. Cl.
| H01L 27/115 | (2017.01) |
| H01L 27/11568 | (2017.01) |
| H01L 29/792 | (2006.01) |
| H01L 21/28 | (2006.01) |

(52) U.S. Cl.
CPC .. *H01L 27/11568* (2013.01); *H01L 29/40114* (2019.08); *H01L 29/792* (2013.01)

(58) Field of Classification Search
CPC ................................................ H01L 27/11568
See application file for complete search history.

(56) References Cited

U.S. PATENT DOCUMENTS

| 6,177,318 | B1* | 1/2001 | Ogura ............... | H01L 27/11521 257/E21.679 |
| 6,794,711 | B2 | 9/2004 | Kang | |
| 2002/0093044 | A1* | 7/2002 | Hsieh ................... | H01L 27/115 257/315 |
| 2004/0188753 | A1* | 9/2004 | Kawashima ...... | H01L 29/42324 257/316 |
| 2009/0045452 | A1 | 2/2009 | Lue | |

* cited by examiner

*Primary Examiner* — Kyoung Lee
*Assistant Examiner* — Christina A Sylvia
(74) *Attorney, Agent, or Firm* — Winston Hsu

(57) ABSTRACT

A semiconductor memory device includes a memory gate disposed on a main surface of a substrate. The memory has a first sidewall and a second sidewall opposite to the first sidewall. A control gate is in proximity to the memory gate. The control gate has a third sidewall directly facing the second sidewall, and a fourth sidewall opposite to the third sidewall. A gap is provided between the second sidewall of the memory gate and the third sidewall of the control gate. A first single spacer structure is disposed on the first sidewall of the memory gate. A second single spacer structure is disposed on the fourth sidewall of the control gate. A gap-filling layer is deposited into the gap and fills up the gap.

9 Claims, 3 Drawing Sheets

SEMICONDUCTOR MEMORY DEVICE AND FABRICATION METHOD THEREOF

BACKGROUND OF THE INVENTION

1. Field of the Invention

The invention relates to a semiconductor memory device. In particular, the invention relates to a 1.5 T SONOS (silicon-oxide-nitride-oxide-silicon) memory device and a manufacturing method thereof.

2. Description of the Prior Art

The fabrication of current 1.5 T SONOS memory device requires the deposition of an inter-poly oxide (IPO) layer to fill the gap between the memory gate and the control gate for insulation purposes. The deposited IPO layer is etched to forma first spacer on a sidewall of the memory gate. Then, a polysilicon layer is deposited in a blanket manner, and then the control gate is defined by a chemical mechanical polishing (CMP) process, a lithography process, and an etching process. Next, second spacers are formed on the first spacer and on a sidewall of the control gate. A source/drain doping region is then formed in the substrate by an ion implantation process.

However, the above-described prior art steps are complicated, and the formed memory cell occupies a large chip area. Therefore, there is still a need in the art for an improved semiconductor memory device, and more particularly to an improved 1.5 T SONOS memory device and method of fabricating the same that overcomes the deficiencies and shortcomings of the prior art described above.

SUMMARY OF THE INVENTION

It is one object of the invention to provide an improved semiconductor memory device and a method of fabricating the same in order to solve the above-mentioned shortcomings or problems.

An embodiment of the present invention provides a semiconductor memory device including a substrate having a main surface, and a memory gate disposed on a main surface of the substrate, wherein the memory gate has a first sidewall and a second sidewall opposite to the first sidewall; a control gate disposed on a side of the memory gate, wherein the control gate has a third sidewall directly facing the second sidewall, and a fourth sidewall opposite to the third sidewall; a gap between the second sidewall of the memory gate and the third sidewall of the control gate; a first single spacer structure disposed on the first sidewall of the memory gate; a second single sidewall structure disposed on the fourth sidewall of the control gate; and a gap filling layer filling up the gap.

According to an embodiment of the invention, the first single spacer structure, the second single spacer structure and the gap filling layer are each composed of only one single layer of dielectric material. For example, the single layer of dielectric material is a silicon nitride layer.

According to an embodiment of the invention, the first single spacer structure directly contacts the first sidewall and the main surface of the substrate, and the second single spacer structure directly contacts the fourth sidewall and the main surface of the substrate.

According to an embodiment of the invention, the gap filling layer directly contacts the second sidewall and the third sidewall.

According to an embodiment of the invention, the gap filling layer has a top surface that is flush with the top surface of the memory gate and the top surface of the control gate.

According to an embodiment of the invention, the semiconductor memory device can further comprise a recessed region located at the bottom of the gap.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Figure 1:
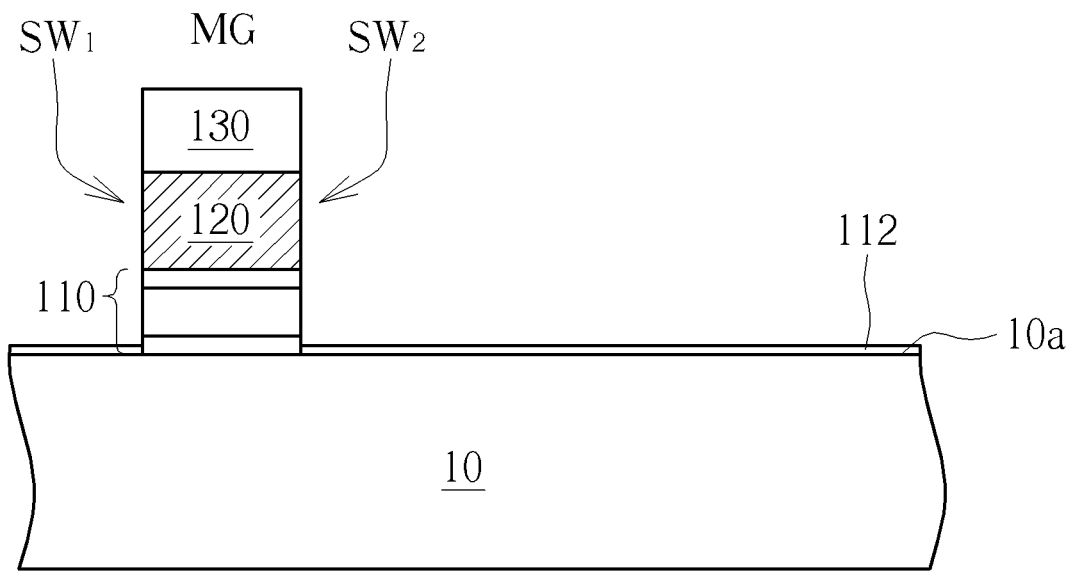
FIG. 1 to FIG. 5 are schematic cross-sectional views showing a method of fabricating a semiconductor memory device according to an embodiment of the invention.

Please refer to FIG. 1 to FIG. 5, which are schematic cross-sectional views showing a method of fabricating a semiconductor memory device according to an embodiment of the invention. As shown in FIG. 1, a substrate 10 is provided. The substrate 10 comprises a main surface 10a. The substrate 10 may be a semiconductor substrate, such as a silicon substrate. Next, a memory gate MG is formed on the main surface 10a of the substrate 10.

According to the embodiments of the present invention, the memory gate MG may include a silicon oxide-silicon nitride-silicon oxide (ONO) film 110, a polysilicon layer 120 disposed on the ONO film 110, and a cap layer 130 disposed on the polysilicon layer 120. The ONO film 110 can be used to store charge. The cap layer 130 may be, for example, a silicon nitride layer. The memory gate MG has a first sidewall $SW_1$ and a second sidewall $SW_2$ opposite to the first sidewall $SW_1$.

At this point, on the main surface 10a of the substrate 10 in the region other than the memory gate MG, there may be a thin oxide layer 112, for example, a silicon dioxide layer.

Figure 2:
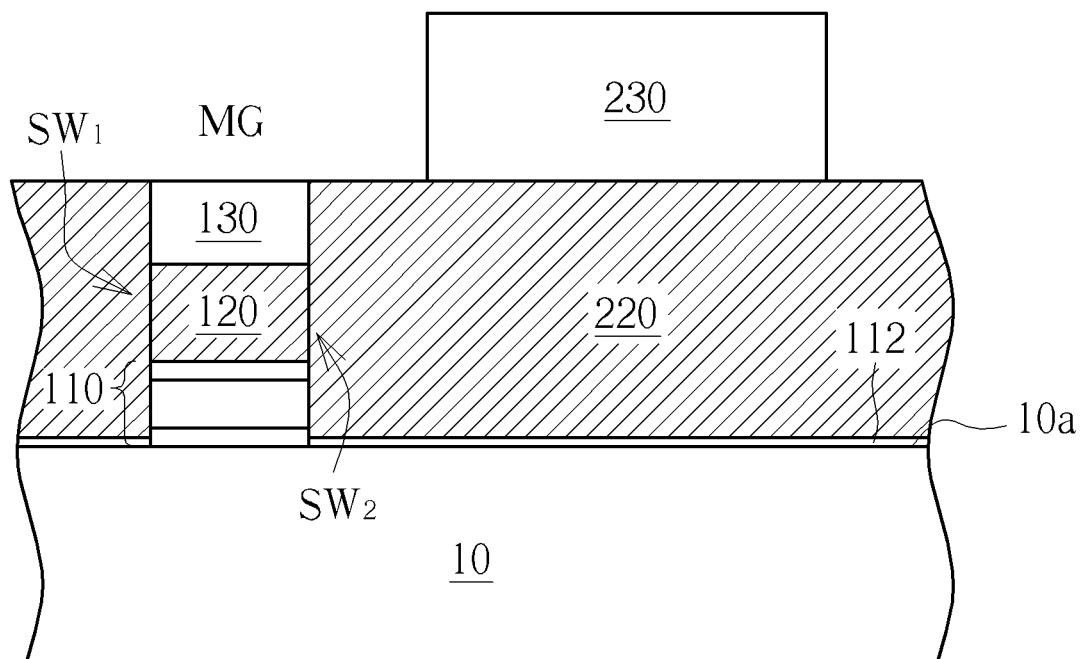

Next, as shown in FIG. 2, a polysilicon layer 220 is deposited in a blanket manner to cover the memory gate MG and the thin oxide layer 112. A chemical mechanical polishing (CMP) process is then performed to polish away portions of the polysilicon layer 220 until the top surface of the cap layer 130 of the memory gate MG is exposed.

At this point, the top surface of the remaining polysilicon layer 220 is flush with the top surface of the cap layer 130 of the memory gate MG. For example, the remaining polysilicon layer 220 has a thickness of about 700 to 800 angstroms. Then, a lithography process is performed. On the polysilicon layer 220, on the side close to the memory gate MG, a photoresist pattern 230 is formed to define the pattern and position of a control gate.

Figure 3:
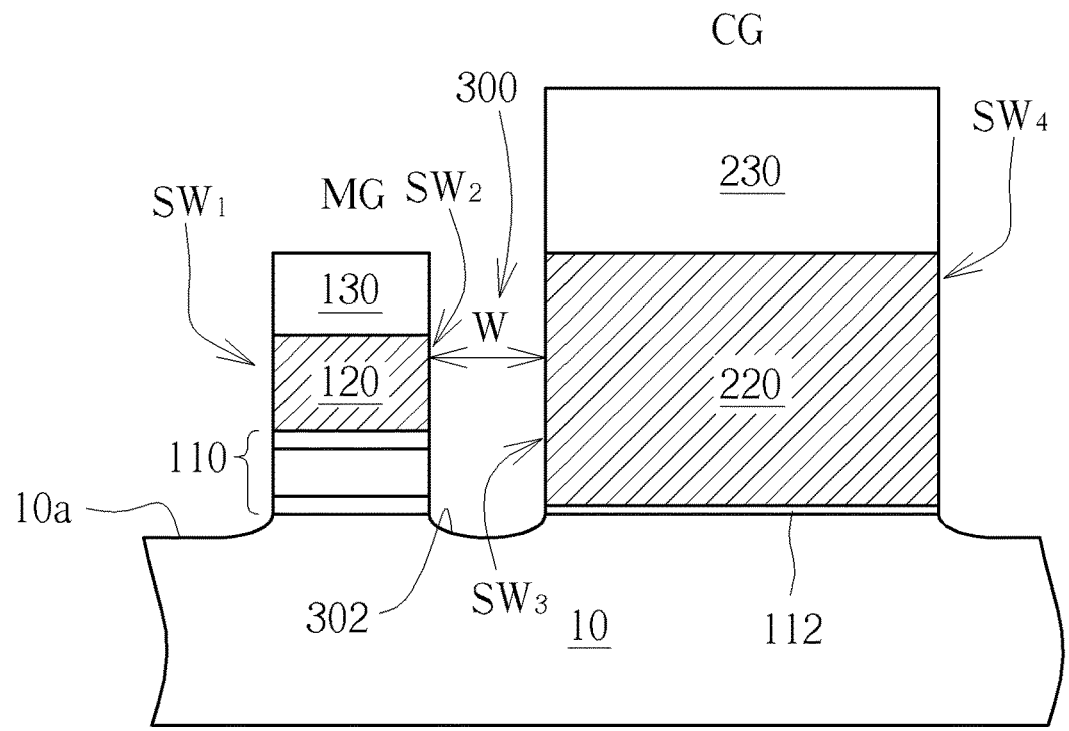

Next, as shown in FIG. 3, the photoresist pattern 230 is used as an etching hard mask, and an anisotropic dry etching process is performed to etch away the polysilicon layer 220 not covered by the photoresist pattern 230. Thus, a control gate CG is formed on one side of the memory gate MG and is in proximity to the memory gate MG.

The control gate CG has a third sidewall SW$_3$ directly facing the second sidewall SW$_2$ and a fourth sidewall SW$_4$ opposite to the third sidewall SW$_3$. A gap 300 is formed between the second sidewall SW$_2$ of the memory gate MG and the third sidewall SW$_3$ of the control gate CG, and a recessed region 302 formed by etching the substrate 10 is formed at the bottom of the gap 300. According to an embodiment of the invention, for example, the width W of the gap 300 is approximately 150 to 200 angstroms.

Figure 4:
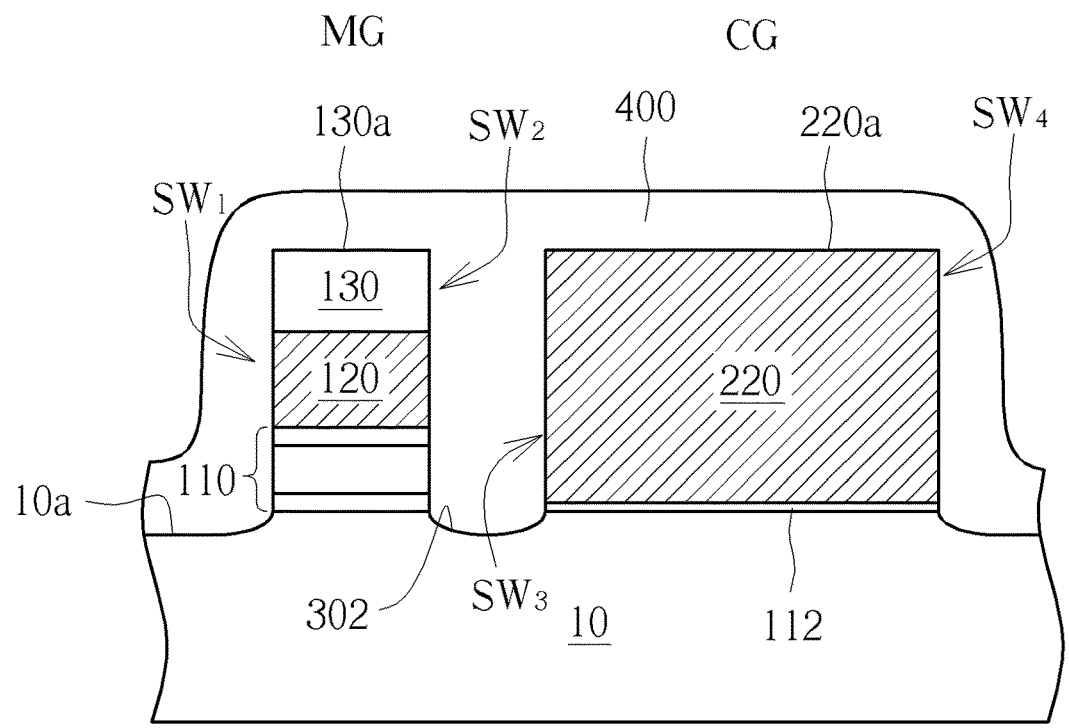

As shown in FIG. 4, after the photoresist pattern 230 is removed, a spacer material layer 400, such as a silicon nitride layer, is then deposited in a blanket manner over the substrate 10. According to an embodiment of the present invention, the spacer material layer 400 may be deposited by an atomic layer deposition (ALD) method such that the spacer material layer 400 can conformally cover the memory gate MG and the control gate CG, and completely fill the gap 300.

Figure 5:
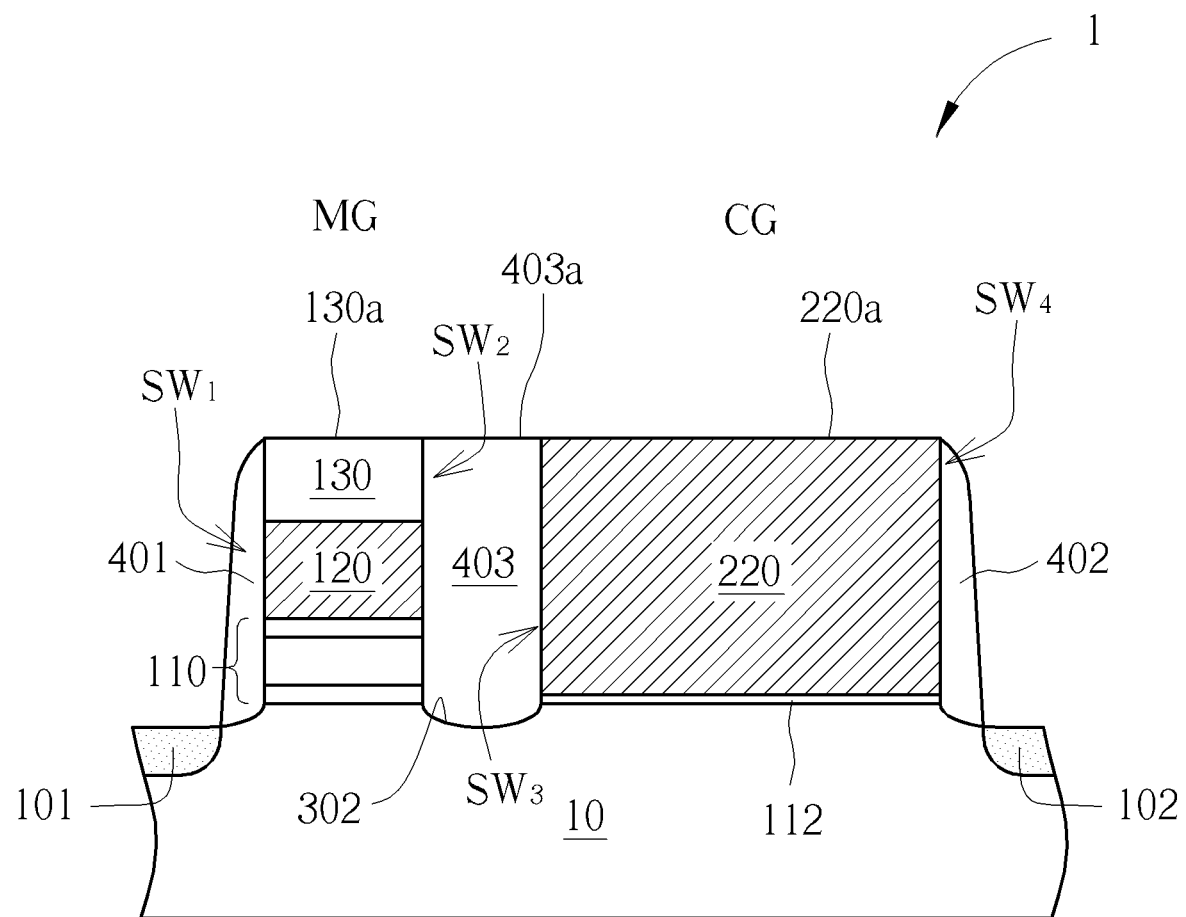

Then, as shown in FIG. 5, an anisotropic dry etching process is performed to etch the spacer material layer 400 until the memory gate MG and the control gate CG are exposed, thereby simultaneously forming a first single spacer structure 401 on the first sidewall SW$_1$ of the memory gate MG and a second single spacer structure 402 on the fourth sidewall SW$_4$ of the control gate CG, and a gap filling layer 403 filling up the gap 300.

According to an embodiment of the invention, the first single spacer structure 401 directly contacts the first sidewall SW$_1$ and the main surface 10a of the substrate 10, and the second single spacer structure 402 directly contacts the fourth sidewall SW$_4$ and the main surface 10a of the substrate 10. The gap filling layer 403 directly contacts the second sidewall SW$_2$ and the third sidewall SW$_3$. The gap filling layer 403 has a top surface 403a that is flush with the top surface 130a of the memory gate MG and the top surface 220a of the control gate CG.

Therefore, one technical feature of the present invention is that the first single spacer structure 401, the second single spacer structure 402, and the gap filling layer 403 all consist of only one single layer of dielectric material (for example, silicon nitride by ALD deposition). There is only one single spacer on both the first sidewall SW$_1$ of the memory gate MG and the fourth sidewall SW$_4$ of the control gate CG, and no extra second spacers are required. This simplifies the process steps.

Finally, an ion implantation process is performed to implant an N-type or P-type dopants into the main surface 10a of the substrate 10 to form a first source/drain doping region 101 adjacent to the first single spacer structure 401, and a second source/drain doped region 102 adjacent to the second single spacer structure 402.

Structurally, it can be seen from FIG. 5 that the semiconductor memory device 1 of the present invention, such as a 1.5 T SONOS memory device, includes a memory gate MG disposed on the main surface 10a of the substrate 10, a control gate CG on a side of the memory gate MG, a gap 300 between the second sidewall SW$_2$ of the memory gate MG and the third sidewall SW$_3$ of the control gate CG, a first single spacer structure 401 on the first sidewall SW$_1$ of the memory gate MG, a second single spacer structure 402 on the fourth sidewall SW$_4$ of the control gate CG, and a gap filling layer 403 filling up the gap 300. In addition, a first source/drain doping region 101 is disposed in the main surface 10a of the substrate 10, adjacent to the first single spacer structure 401, and a second source/drain doping region 102, adjacent to the second single spacer structures 402.

The 1.5 T SONOS memory device disclosed in the present invention is characterized in that the inter-poly oxide (IPO) layer deposition and etching steps in the prior art can be omitted, thereby simplifying the process steps and saving process cost. Further, since it is not necessary to form the first spacer composed of the IPO layer on the sidewall of the memory gate MG, the formed memory cell occupies a smaller chip area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate having a main surface;
   a memory gate disposed on the main surface of the substrate, wherein the memory has a first sidewall and a second sidewall opposite to the first sidewall;
   a control gate in proximity to the memory gate, wherein the control gate has a third sidewall directly facing the second sidewall, and a fourth sidewall opposite to the third sidewall;
   a gap between the second sidewall of the memory gate and the third sidewall of the control gate;
   a first single spacer structure on the first sidewall of the memory gate;
   a second single spacer structure on the fourth sidewall of the control gate; and
   a gap-filling layer filling up the gap, wherein the gap filling layer is in direct contact with the second sidewall and the third sidewall.

2. The semiconductor memory device according to claim 1, wherein the first single spacer structure, the second single spacer structure and the gap filling layer all consist of only one layer of dielectric material.

3. The semiconductor memory device according to claim 2, wherein said only one layer of dielectric material is a silicon nitride layer.

4. The semiconductor memory device according to claim 1, wherein the first single spacer structure is in direct contact with the first sidewall and the main surface of the substrate, the second single spacer structure is in direct contact with the fourth sidewall and the main surface of the substrate.

5. The semiconductor memory device according to claim 1, wherein the gap filling layer has a top surface that is flush with a top surface of the memory gate and a top surface of the control gate.

6. The semiconductor memory device according to claim 1 further comprising:
   a first source/drain doping region disposed in the main surface of the substrate and adjacent to the first single spacer structure; and
   a second source/drain doping region disposed in the main surface of the substrate and adjacent to the second single spacer structure.

7. The semiconductor memory device according to claim 1 further comprising:
   a recessed region at a bottom of the gap.

8. The semiconductor memory device according to claim 1, wherein the memory gate comprises an oxide-nitride-oxide (ONO) film, a polysilicon layer on the ONO film, and a cap layer on the polysilicon layer.

9. The semiconductor memory device according to claim 1, wherein the control gate comprises a polysilicon layer.

* * * * *